United States Patent [19]
Alston et al.

[11] Patent Number: 6,163,550
[45] Date of Patent: Dec. 19, 2000

[54] STATE DEPENDENT SYNCHRONIZATION CIRCUIT WHICH SYNCHRONIZES LEADING AND TRAILING EDGES OF ASYNCHRONOUS INPUT PULSES

[75] Inventors: Jerald Alston, Portola Hills; Ting-Li Chan, Laguna Niguel, both of Calif.

[73] Assignee: QLogic Corporation, Aliso Viejo, Calif.

[21] Appl. No.: 08/972,117

[22] Filed: Nov. 17, 1997

[51] Int. Cl.$^7$ ................................................ H03K 21/00
[52] U.S. Cl. ........................ 370/503; 375/370; 375/354; 370/520
[58] Field of Search ..................... 375/354, 355, 375/356, 358, 360, 364, 370; 370/350, 503, 520; 327/141, 146, 154

[56] References Cited

U.S. PATENT DOCUMENTS

| | | |
|---|---|---|
| 4,225,960 | 9/1980 | Masters . |
| 4,390,969 | 6/1983 | Hayes . |
| 4,408,333 | 10/1983 | Fujii . |
| 4,498,176 | 2/1985 | Wagner . |
| 4,745,302 | 5/1988 | Hanawa et al. . |
| 4,851,710 | 7/1989 | Grivna . |
| 4,866,606 | 9/1989 | Kopetz . |
| 4,914,325 | 4/1990 | Yamada ................................... 307/592 |
| 4,920,535 | 4/1990 | Watanabe et al. . |
| 4,926,445 | 5/1990 | Robb . |
| 4,935,942 | 6/1990 | Hwang et al. . |
| 4,965,465 | 10/1990 | Denda . |
| 4,973,860 | 11/1990 | Ludwig . |
| 5,012,127 | 4/1991 | Gates et al. . |
| 5,083,049 | 1/1992 | Kagey . |
| 5,117,442 | 5/1992 | Hall . |
| 5,146,585 | 9/1992 | Smith, III . |
| 5,155,745 | 10/1992 | Sugawara et al. . |
| 5,237,593 | 8/1993 | Fisher et al. . |
| 5,276,807 | 1/1994 | Kodama et al. . |
| 5,331,669 | 7/1994 | Wang et al. . |
| 5,418,825 | 5/1995 | Cantrell et al. ........................... 377/48 |
| 5,537,655 | 7/1996 | Truong ..................................... 375/356 |
| 5,729,719 | 3/1998 | Gates . |
| 5,896,052 | 4/1999 | Gujral et al. ............................. 327/144 |

OTHER PUBLICATIONS

Walker et al., A New Synchronizer Design, IEEE Transaction son Computers, vol. 45, No. 11, pp. 1–4, Nov. 1996.

Shieh et al., A scan design for asynchronous sequential logic circuits using SR–latches, Circuits and Systems, vol. 2, pp. 1300–1303, Nov. 1996.

Primary Examiner—Chi H. Pham
Assistant Examiner—Frank Duong
Attorney, Agent, or Firm—Knobbe, Martens, Olson & Bear, LLP

[57] ABSTRACT

A state dependent synchronization circuit synchronizes an asynchronous input signal to a clock signal to generate a synchronous output signal. The circuit synchronizes both the leading edge and the trailing edge of the input signal and also maintains the state of the output signal at a level corresponding to the input signal when the input signal does not change. The circuit includes an input signal latch which receives the input signal and provides a latched signal which does not charge state even if the input signal subsequently changes state until the latched signal is synchronized to the clock signal. The circuit further includes a synchronizer which synchronizes the latched signal with the clock signal. The synchronizer provides feedback signals to the input signal latch to permit the input signal latch to recognize a change in the state of the input signal only after the synchronizer has synchronized the previous state of the input signal. The synchronizer preferably includes a first stage and a second stage. The first stage of the synchronizer isolates the second stage from any oscillation which may occur if the latched signal changes state too close to a transition in the clock signal. The first stage and the second stage of the synchronizer preferably operate on opposite edges of the clock signal. The circuit preferably includes a pair of cross-coupled gates that enable the circuit to recognize and synchrinize pulses of very short duration.

12 Claims, 3 Drawing Sheets

STATE DEPENDENT SYNCHRONIZATION CIRCUIT WHICH SYNCHRONIZES LEADING AND TRAILING EDGES OF ASYNCHRONOUS INPUT PULSES

BACKGROUND OF THE INVENTION

1. Field of the Invention

The present invention is in the field of circuits for synchronizing asynchronous digital input signals with a clock signal.

2. Description of the Related Art

Digital circuits in an electronic system, such as, for example, a computer system, are typically controlled by a common clock signal or by a plurality of clock signals derived from a common clock signal. Thus, the circuits are "synchronized" with respect to each other so that a signal generated by a first circuit in the system can be received by and clocked into other circuits in the system because the signals generated by the first circuit have a known phase relationship with respect to the common system clock signals. The known phase relationships typically do not exist for circuits that are controlled by independent clock signals. For example, peripheral components of a computer system often use independent clocks so that the peripheral component operates at a known frequency irrespective of the operating frequency of a computer system to which it is interconnected. Although the clock signals of a peripheral component and a computer system may have the same or similar frequencies, even very small differences in the clock frequencies cause the phase relationships between the clock signals to vary. Thus, the independent clock signals are "asynchronous" with respect to each other. Therefore, if a signal is generated by a circuit controlled by a clock which is asynchronous with the system clock of a computer system, the signal cannot be simply provided to the circuits of the computer system and clocked by the clock signals derived from the system clock. Rather, the signal must be synchronized to the system clock before the signal can be applied to the circuits of the computer system.

Many synchronization circuits operate only to synchronize a particular edge of an asynchronous input signal. For example, if the input signal is an interrupt signal or a handshake signal, either a particular rising edge (low-to-high transition) or falling edge (high-to-low transition) is used to indicate or initiate an event. The actual state of the input signal may not be relevant and the opposite transition may not need to be synchronized. On the other hand, the current states of other input signals may be relevant, and it is necessary to synchronize both the transition to each state and the transition from each state as well as maintaining an output level responsive to the steady state input level of the input signal. Thus, a synchronization circuit which synchronizes both transitions is needed.

SUMMARY OF THE INVENTION

The present invention provides a state dependent synchronization circuit which receives an asynchronous input signal and synchronizes the asynchronous input signal to a system clock. The synchronization circuit synchronizes both the low-to-high transitions and the high-to-low transitions of the input signal and maintains a steady state output signal when the input signal is at a steady state level.

One aspect of the present invention is a synchronization circuit which receives an asynchronous input signal and which generates a synchronous output signal responsive to the logic levels of the asynchronous input signal. The circuit comprises an input signal selector and a latch which receive the asynchronous input signal and generate a latched output signal. The input signal selector and latch further receive a feedback signal. The input signal selector and latch are responsive to a transition of the asynchronous input signal from a low logic level to a high logic level when the feedback signal has a first state and are responsive to a transition of the asynchronous input signal from a high logic level to a low logic level when the feedback signal has a second state. A synchronizer receives the latched output signal and a clock signal. The synchronizer generates a synchronized output signal which has a state which only changes logic levels on a predetermined edge of the clock signal. The synchronizer generates the feedback signal in response to the state of the synchronized output signal. In particular embodiments, the signal selector comprises a transition selector responsive to the feedback signal. The transition selector selects a first logic level of the asynchronous input signal as a selected logic level to which the input signal selector and latch are sensitive when the feedback signal has a first state. The transition selector selects a second logic level of the asynchronous input signal as the selected logic level to which the input signal selector and latch are sensitive when the feedback signal has a second state. The transition selector provides a first active output signal when the asynchronous input signal changes to the first logic level when the feedback signal has the first state. The transition selector provides a second active output signal when the asynchronous input signal changes to the second logic level when the feedback signal has the second state. Also in particular embodiments, the latch has a first latched output state and a second latched output state. The latch receives the second active output signal from the transition selector and changes from the first latched output state to the second latched output state. The latch receives the first active output signal from the transition selector and changes from the second latched output state to the first latched output state.

In certain embodiments, the signal synchronizer comprises a first clocked flip-flop having a first clock input, a first data input and a first clocked output signal. The first data input is connected to receive a signal responsive to the latched output signal from the input signal latch portion. The first clock input receives the clock signal. The first clocked output signal changes states responsive to changes in the state of the latched output signal. The first clocked output signal changes state on occurrence of a first selected transition of the clock signal. A second clocked flip-flop has a second clock input, a second data input and a second clocked output signal. The second data input is connected to receive a signal responsive to the first clocked output signal from the first clocked flip-flop. The second clock input receives the clock signal. The second clocked output signal changes states responsive to changes in the state of the first clocked output signal. The second clocked output signal changes state on occurrence of a second selected transition of the clock signal. The synchronized output signal is responsive to the second clocked output signal. Preferably, the first selected transition of the clock signal comprises a transition of the clock signal from a first logic level to a second logic level. The second selected transition of the clock signal comprises a subsequent transition of the clock signal from the second logic level to the first logic level. Preferably, the feedback signal changes states when the second clocked output signal changes states.

Another aspect of the present invention is a circuit which synchronizes an asynchronous input signal with a clock signal to generate an synchronized output signal which changes states in synchronism with the clock signal. The circuit comprises an input signal selector responsive to a current level of the synchronized output signal to select a selected one of a first level and a second level of the asynchronous input signal to which to respond. The input signal selector generates a selector output signal when the asynchronous input signal changes to the selected one of the first level and the second level. A latch is responsive to the selector output signal to generate a latched output signal having a first latched state when the asynchronous input signal has the first level and having a second latched state when the asynchronous input signal has the second level. A synchronizer is responsive to the latched output signal and to the clock signal to clock the latched output signal on a selected transition of the clock signal to generate the synchronized output signal.

Another aspect of the present invention is a circuit which synchronizes an asynchronous input signal with a clock signal to generate an synchronized output signal which changes states in synchronism with the clock signal. The circuit comprises an asynchronous input circuit responsive to a feedback signal which selects a selected one of first and second levels of the asynchronous input signal to which to respond. The asynchronous input circuit outputs a first active output signal when the asynchronous input signal changes to the selected one of the first and second levels. An asynchronous latch circuit is responsive to the first active output signal to output a latched output signal responsive to the first active output signal. A synchronizer circuit receives the latched output signal and the clock signal and generates the synchronous output signal. The synchronizer circuit further generates the feedback signal. The feedback signal causes the asynchronous input circuit to be in a state to select one of the first and second levels opposite a previously selected one of the first and second levels.

Preferably, the latch circuit comprises cross-coupled gates wherein one of the gates provides the latched output signal. The use of cross-coupled gates enables the circuit to recognize and synchronize pulses of very short duration. The latched output signal has first and second stable states. The active output signal from the asynchronous input circuit causes the latched output signal to switch from one of the first and second stable states to the other of the first and second stable states. Also preferably, the synchronizer circuit comprises first and second flip-flops. The first flip-flop receives the latched output signal and generates a first clocked output signal synchronized with a first transition of the clock signal. The second flip-flop receives the first clocked output signal and generates a second clocked output signal synchronized with a second transition of the clock signal. In one embodiment, the first transition of the clock signal is a transition from a first clock logic level to a second clock logic level and the second transition of the clock signal is a transition from the second clock logic level to the first clock logic level which occurs one-half of a clock cycle after the first transition. The feedback signal preferably comprises a signal responsive to a logic level of the synchronized output signal. In particular embodiments, the selected one of the first and second levels of the asynchronous input signal to which to respond corresponds to an opposite logic level of a logic level of a current state of the synchronized output signal.

BRIEF DESCRIPTION OF THE DRAWINGS

The present invention will be described below in connection with the accompanying drawing figures in which.

DETAILED DESCRIPTION OF THE PREFERRED EMBODIMENT

Figure 1:
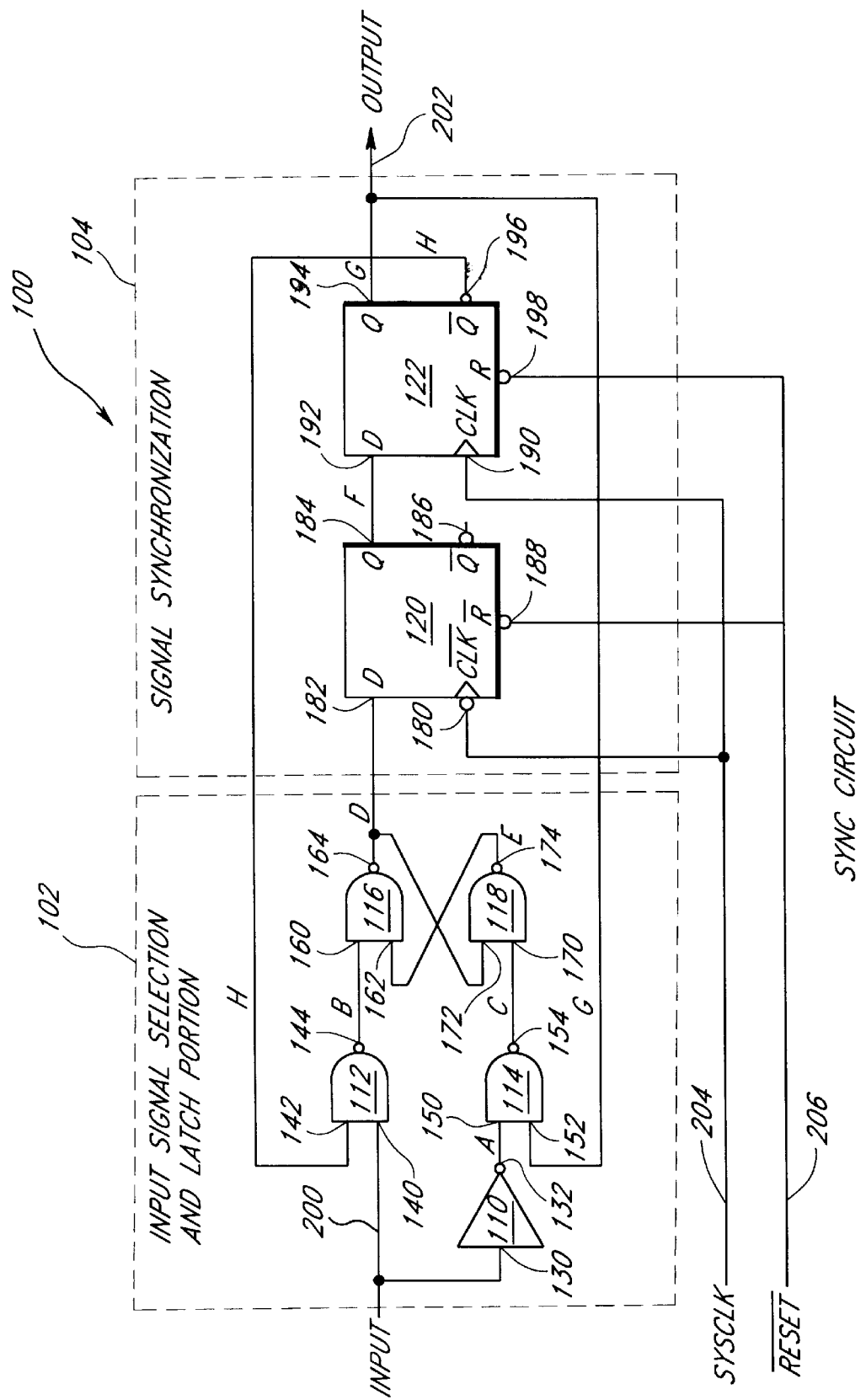
FIG. 1 illustrates a logic diagram of a preferred embodiment of the present invention.

FIG. 1 illustrates an exemplary synchronization circuit 100 in accordance with the present invention. The circuit 100 comprises an input signal selector and latch circuit 102 and a signal synchronizer 104. As described below, the input signal selector and latch circuit 102 receives the input signal and latches the input signal until the latched input signal has been synchronized by the signal synchronizer 104. The input signal and latch circuit 102 receives feedback from the signal synchronizer 104 which indicates when the synchronization has been completed and controls to which logic level of the input signal the input signal selector and latch circuit 102 is currently responsive.

The input signal selector and latch circuit 102 comprises an inverter 110, a first NAND gate 112, a second NAND gate 114, a third NAND gate 116 and a fourth NAND gate 118. The signal synchronizer 104 comprises a first D-type flip-flop 120 and a second D-type flip-flop 122.

The inverter 110 has an input 130 and an output 132. The first NAND gate 112 has a first input 140, a second input 142 and an output 144. The second NAND gate 114 has a first input 150, a second input 152 and an output 154. The third NAND gate 116 has a first input 160, a second input 162 and an output 164. The fourth NAND gate 114 has a first input 170, a second input 172 and an output 174.

The first flip-flop 120 has an inverted clock ($\overline{CLK}$) input 180, a data (D) input 182, a true (Q) output 184 and a complement ($\overline{Q}$) output 186. The first flip-flop 120 may also have an active low reset ($\overline{R}$) input 188. The second flip-flop 122 has a clock (CLK) input 190, a data (D) input 192, a true (Q) output 194 and a complement ($\overline{Q}$) output 196. The first flip-flop 122 may also have a reset ($\overline{R}$) input 198.

The input 130 of the inverter 110 and the first input 140 of the first NAND gate 112 are connected together and are connected to an input line 200 which receives an input signal (INPUT) which is to be synchronized. The output 132 of the inverter 110 generates a signal A. The output 132 is connected to the first input 150 of the second NAND gate 114. The second input 142 of the first NAND gate 112 is connected to the $\overline{Q}$ output 196 of the second flip-flop 122. The $\overline{Q}$ output 196 generates a signal H which will be described below. The second input 152 of the second NAND gate 114 is connected to the Q output 194 of the second flip-flop 122. The Q output 194 generates a signal G which will be described below. As will be understood from the following description, the signal G and the signal H together comprise a feedback signal from the signal synchronizer 104 to the input signal selector and latch circuit 102.

The output 144 of the first NAND gate 112 generates a signal B which is provided to the first input 160 of the third NAND gate 116. The output 154 of the second NAND gate 114 generates a signal C which is provided to the first input 170 of the fourth NAND gate 118. As will be understood from the following description, the inverter 110, the first NAND gate 112 and the second NAND gate 114 operate as an input level selector portion of the input signal selector and latch circuit 102. That is, the input level selector portion is responsive to the feedback signal to determine which level of the INPUT signal causes the output of the input signal selector and latch circuit 102 to change state.

The output 164 of the third NAND gate 116 generates a signal D which is provided to the second input 172 of the fourth NAND gate 118 and to the D input 182 of the first flip-flop 120. The output 174 of the fourth NAND gate 118 generates a signal E which is provided to the second input 162 of the third NAND gate 116. Thus, as will be described more fully below, the third NAND gate 116 and the fourth NAND gate 118 operate as the latch portion of the input signal selector and latch circuit 102. The latch portion receives the B signal and the C signal from the selector portion, and the D signal changes from a first latched output state to a second latched output state when the corresponding B signal or the C signal transitions to a low logic level.

The Q output 184 of the first flip-flop 120 generates a signal F which is provided to the D input 192 of the second flip-flop 122. The $\overline{Q}$ output 186 of the first flip-flop 120 is not connected in the embodiment of FIG. 1.

The Q output 194 of the second flip-flop 122 is the G signal which is also provided as the synchronized output signal (OUTPUT) on an output signal line 202. The G signal is also provided as a first feedback signal to the input signal selector and latch circuit 102. The $\overline{Q}$ output 196 of the second flip-flop 122 is the H signal which is provided as a second feedback signal to the input signal selector and latch 102. it should be understood that because the H signal is the inverse (i.e., complement) of the G signal, only a single signal needs to be fed back to the input selector and latch circuit 102 and that the signal can be inverted within the input selector and latch circuit 102. Thus, the two signals can be considered as a single feedback signal.

The inverted clock input ($\overline{CLK}$) of the first flip-flop 120 and the noninverted clock input (CLK) of the second flip-flop 122 are connected to receive a system clock (SYSCLK) signal on a SYSCLK line 204. It should be understood that the first flip-flop 120 and the second flip-flop 122 are edge-triggered flip-flops wherein the signal on the respective D input is propagated to the respective Q output on the active edge of the signal applied to the clock input line. Thus, the first flip-flop 120 is triggered by the high-to-low transition of the system clock signal on the line 204 in the middle of each cycle of the system clock, and the second flip-flop 122 is triggered on the low-to-high transition of the system clock signal on the line 204 at the beginning of each cycle of the system clock (where the beginning of a system clock cycle is understood to be the low-to-high transition of the system clock).

The reset input 188 of the first flip-flop 120 and the reset input 198 of the second flip-flop 122 are connected to a reset line 206 which is connected to receive an active low $\overline{RESET}$ input signal. Optionally, the reset line 206 can be connected to a pullup signal to maintain the reset line 206 at an inactive high signal level.

Figure 2:
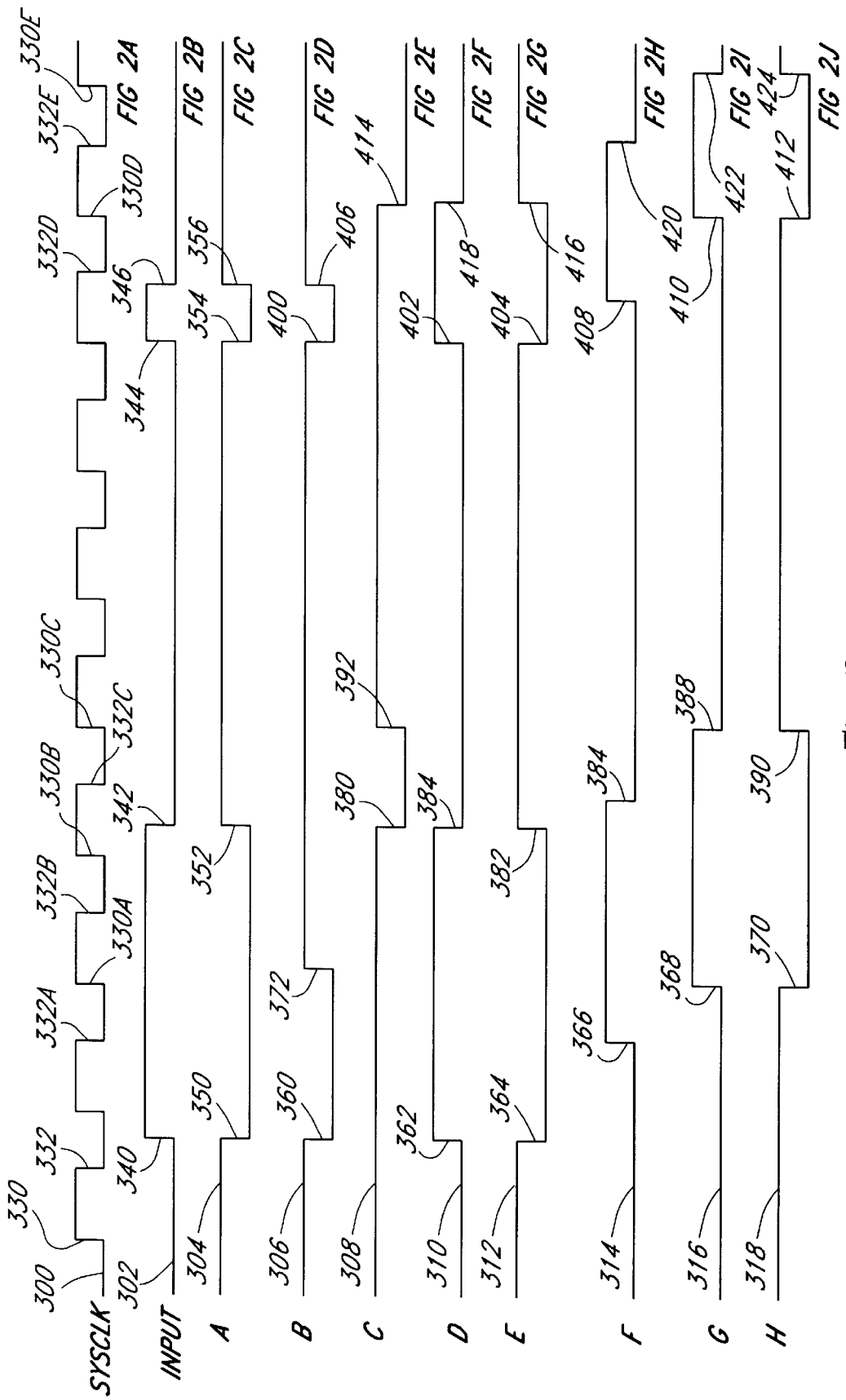
FIG. 2 (comprising FIGS. 2A–2J) illustrates a timing diagram which explains the operation of the embodiment of FIG. 1.
Figure 3:
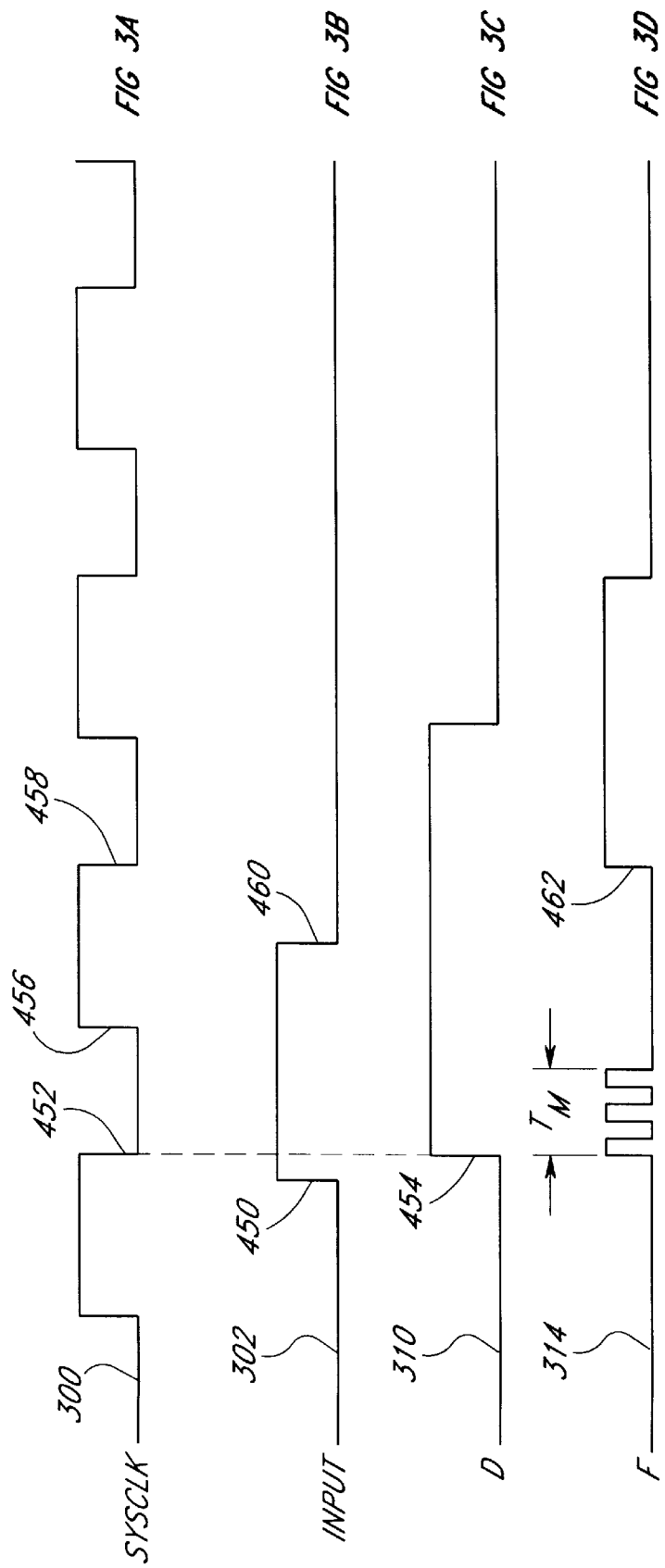
FIG. 3 (comprising FIGS. 3A–3D) illustrates a timing diagram which shows the solution to the metastability problem provided by the tandem flip-flops of FIG. 1.

The operation of the synchronization circuit 100 can be understood by referring to the timing diagrams in FIG. 2 (comprising FIGS. 2A–2J). FIG. 2A illustrates the system clock (SYSCLK) signal 300 to which the input signal is to be synchronized. FIG. 2B illustrates the asynchronous INPUT signal 302 to be synchronized to the system clock signal 300. FIG. 2C illustrates the A signal 304 at the output 132 of the inverter 110. FIG. 2D illustrates the B signal 306 on the output 144 of the first NAND gate 112. FIG. 2E illustrates the C signal 308 on the output 154 of the second NAND gate 114. FIG. 2F illustrates the D signal 310 on the output 164 of the third NAND gate 116. FIG. 2G illustrates the E signal 312 on the output 174 of the fourth NAND gate 118. FIG. 2H illustrates the F signal 314 on the Q output 184 of the first flip-flop 120. FIG. 2I illustrates the G signal 316 on the Q output 194 of the second flip-flop 122 which is also the OUTPUT signal on the line 202. FIG. 2J illustrates the H signal 318 on the $\overline{Q}$ output 196 of the second flip-flop 122. In FIGS. 2B–2J, the signals are shown at the left margin with the respective logic levels each of the signals would have when the INPUT signal 302 has been at a logic zero (i.e., low level) for a sufficient time for the present invention to have reached a steady-state condition.

The SYSCLK signal 300 in FIG. 2A is illustrated as a generally square wave signal (i.e., a signal having an approximately 50 percent duty cycle of high and low logic levels). At the beginning of each cycle, the signal 300 switches from a low logic level to a high logic level at a low-to-high transition (rising edge) 330. In the middle of each cycle, the signal 300 switches from a high logic level to a low logic level at a high-to-low transition (falling edge) 332. At the end of each cycle, the signal 300 switches from a low logic level to a high logic level at the next rising edge 330 which is also the beginning of the next cycle of the signal 300.

The INPUT signal 302 in FIG. 2B is an asynchronous input signal which has a low state and a high state. Either state of the INPUT signal may be considered as an active state because the present invention operates to synchronize the transitions of the INPUT signal 302 from either state to the other state and also operates to reproduce the current logic level of the INPUT signal 302 when the INPUT signal 302 remains at either logic level. Because the INPUT signal 302 is asynchronous, a transition in the logic level of the INPUT signal 302 can occur at any time with respect to the SYSCLK signal 300. For example, in FIG. 2B, the INPUT signal 302 has a first low-to-high transition 340 during the second half of a cycle of the SYSCLK signal 300 in FIG. 2A and has a first high-to-low transition 342 during the first half of a subsequent cycle of the SYSCLK signal 300. Thereafter, the INPUT signal 302 has a second low-to-high transition 344 during the first half of a cycle of the SYSCLK signal 300, followed by a second high-to-low transition 346 during the same half cycle of the SYSCLK signal 300.

The A signal 304 in FIG. 2C is the complement of the INPUT signal 302 delayed by a small propagation delay. Thus, the A signal 304 has a first high-to-low transition 350 (corresponding to the first low-to-high transition 340 of the INPUT signal 302), followed by a first low-to-high transition 352, a second high-to-low transition 354 and a second low-to-high transition 356.

As illustrated in FIG. 2D, the first low-to-high transition 340 of the INPUT signal 302 also causes a high-to-low transition 360 in the B signal 306 on the output 144 of the first NAND-gate 112, because, as illustrated in FIG. 2J, the H signal 31.8 is at a high logic level. Thus, when the low-to-high transition 340 occurs both inputs (140, 142) to the first NAND-gate 112 are active high, and the output 144 becomes 20 active low.

Although the A signal 304 makes the high-to-low transition 350 on the input 150 of the second NAND-gate 114, the C signal 308 on the output 154 of the second NAND-gate 114 does not change because the G signal 316 (FIG. 2I) is already low which forces the output 154 high.

The high-to-low transition 360 of the B signal 306 on the input 160 of the third NAND-gate 116 causes a low-to-high transition 362 of the D signal 310 (FIG. 2F) on the output 164 of the third NAND-gate 116. The low-to-high transition 362 of the D signal 310 on the input 172 of the fourth NAND-gate 118 causes a high-to-low transition 364 of the signal E (FIG. 2G) on the output 174 of the fourth NAND-gate 118 because the signal D on the input 170 is already high.

The third NAND-gate 116 and the fourth NAND-gate 118 operate as a cross-coupled flip-flop. That is, the low state of the E signal is coupled to the input 162 of the third NAND-gate 116 to cause the D signal on the output 164 of the third NAND-gate 116 to remain high irrespective of whether the INPUT signal 302 changes logic levels until, as described below, the synchronization of the low-to-high transition 340 of the INPUT signal 302 has been completed. This has the advantage that a short pulse on the INPUT signal 302 will be recognized and synchronized, as will also be described more filly below.

The D signal is provided to the input 182 of the first flip-flop 120. As discussed above, the first flip-flop 120 is triggered by falling edges 332 of the SYSCLK signal 300. Thus, on the next falling edge 332A of the SYSCLK signal 300, the high level of the D signal is clocked into the first flip-flop 120, and, after a short propagation delay, the F signal 314 on the Q output 184 of the first flip-flop 120 makes a low-to-high transition 366. The F signal 314 is provided to the D input 192 of the second flip-flop 122, which, as discussed above, is triggered on the rising edges 330 of the SYSCLK signal 300. Thus, the high level on the F signal 314 is clocked into the second flip-flop 122 on the very next rising edge 330A, and, after a short propagation delay, the G signal on the Q output 194 of the second flip-flop 122 makes a low-to-high transition 368, and the H signal on the $\overline{Q}$ output 196 makes a high-to-low transition 370.

The high logic level of the G signal 316 is fed back to the second input 152 of the second NAND gate 114; however, as illustrated, the A signal on the first input 150 is still at a low high level, which forces the C signal on the output 154 high. Thus, the high logic level of the G signal 316 has no effect at this time.

The low logic level of the H signal 318 is fed back to the second input 142 of the first NAND gate 112. Although the INPUT signal 302 remains high in this example, the low logic level of the H signal 318 causes the B signal 306 on the output 144 of the first NAND gate 112 to make a low-to-high transition 372. The low-to-high transition 372 of the B signal on the first input 160 of the third NAND gate 116 has no immediate effect for this example because the E signal 312 on the second input 162 remains low and thus causes the D signal 310 on the output 164 to remain high. Thus, the first flip-flop 120 will again clock a high logic level through to the F signal 314 on the output 184 on the next falling edge 332B. Similarly, the second flip-flop 122 will again clock the high logic level F signal 314 to the G signal 316 and will clock the complement (i.e., logic low level) to the H signal 318 on the next rising edge 330B.

When the INPUT signal 302 makes the high-to-low transition 342, the circuit operates in a similar manner to clock the low logic level through to the G signal 316. It should be noted however that the A signal 304 (i.e., the complement of the INPUT signal 302) initiates the operation. In particular, when the INPUT signal 302 makes the high-to-low transition 342 at the first input 140 of the first NAND gate 112, the transition 342 has no effect on the B signal on the output 144 of the first NAND gate 112 because the H signal 318 on the second input 142 is already at a low logic level to force the B signal to a high logic level. On the other hand, the low-to-high transition 352 of the A signal 304 on the first input 150 of the second NAND gate 114 causes the C signal 308 to make a high-to-low transition 380, which in turn causes the E signal 312 to make a low-to-high transition 382. At this time, both the B signal 306 and the E signal 312 are at a high logic level at the inputs 160, 162 of the third NAND gate 116. Thus, the D signal 310 on the output 164 makes a high-to-low transition 384. The low logic level on the D signal 310 is clocked into the first flip-flop 120 on the next falling edge 332C of the SYSCLK signal 300, causing the F signal 314 to make a high-to-low transition 386. The low logic level on the F signal 314 is clocked into the second flip-flop 122 on the next rising edge 330C of the SYSCLK signal 300 causing the G signal 316 to make a high-to-low transition 388 and the H signal 318 to make a low-to-high transition 390. The low logic level of the G signal 316 causes the C signal 308 to make a low-to-high transition 392.

It can be seen from the foregoing that the circuit 100 operates to generate an OUTPUT signal (corresponding to the G signal 316) on the line 202 which synchronizes the INPUT signal 302 with the rising edges 330 of the SYSCLK signal 300. Thus, the OUTPUT signal 316 is synchronized with other circuits which are clocked by the SYSCLK signal 300.

It should be appreciated that the first feedback signal (G) and the second feedback signal (H) are complementary (i.e., the signal G and the signal H always have opposite logic levels). Thus, one feedback signal can be readily generated by inverting the other feedback signal. Thus, the two feedback signals can be considered as being a single feedback signal which has a first active level which enables the first NAND-gate 112 to be responsive to the next low-to-high transition of the INPUT signal on the line 200 and which has a second active level which enables the second NAND-gate 114 to be responsive to the next high-to-low transition of the INPUT signal.

The foregoing example described an INPUT signal 302 having a duration of at least one cycle of the SYSCLK signal 300. As further illustrated in FIGS. 2A–3J, the INPUT signal 302 can have a duration shorter than one cycle, and can be a pulse having both the low-to-high transition 344 and the high-to-low transition 346 occur between the transition 330 and the transition 332 of the SYSCLK signal 300. As illustrated, the low-to-high transition 344 of the INPUT signal 302 causes the high-to-low transition 354 in the A signal 304. The low-to-high transition 344 of the INPUT signal 302 also causes a high-to-low transition 400 of the B signal 306. The high-to-low transition 400 of the B signal 306 causes a low-to-high transition 402 of the D signal 310, which causes a high-to-low transition 404 of the E signal 312. The low logic level on the E signal 312 causes the cross-couple flip-flop formed by the third NAND gate 116 and the fourth NAND gate 118 to latch up. Thus, although the INPUT signal 302 makes the high-to-low transition 346 which results in the low-to-high transition of the A signal 304 and a low-to-high transition of 406 of the B signal 306, the D signal 310 does not change and remains at high logic level. Thus, although the INPUT signal 302 is no longer at a high logic level when the next falling edge 332D of the SYSCLK 300 occurs, the high logic level of the D signal 310 is clocked into the first flip-flop 120 which causes a low-to-high transition 408 of the F signal 314. Thereafter, at the next rising edge 330D of the SYSCLK signal 300, the high level of the F signal 314 is clocked into the second flip-flop 122 to cause a low-to-high transition 410 of the G signal 316 and a high-to-low transition 412 of the H signal 318.

In this example, the high-to-low transition 412 of the H signal 318 has no immediate effect because the INPUT signal 302 on the first input 140 of the first NAND gate 112 is already low to force the B signal 306 high. On the other hand, the low-to-high transition 410 of the G signal 316 has an immediate effect because the A signal 304 on the first input 150 of the second NAND gate 114 is already high. Thus, the low-to-high transition 410 of the G signal 316 causes a high-to-low transition 414 of the C signal 308, which causes a low-to-high transition 416 of the E signal 312. The high level of the E signal 314 on the second input 162 of the third NAND gate 116 combined with the already high B signal 308 on the first input 160 causes the D signal 310 on the output 164 of the third NAND gate 116 to make a high-to-low transition 418.

The low logic level of the D signal 310 is clocked into the first flip-flop 120 on the next falling edge 332E of the SYSCLK signal 300 to cause the F signal 314 to make a high-to-low transition 420. The low logic level on the F signal 314 is clocked into the second flip-flop 122 on the next rising edge 330E of the SYSCLK 300 to cause the G signal 316 to make a high-to-low transition 422 and to cause the H signal to make a low-to-high transition 424.

It can be seen in this second example that the circuit 100 operates to synchronize a pulse of the INPUT signal 302 which has a duration less than a cycle of the SYSCLK signal 300 and which may have changed to its original logic level before the next falling edge of the SYSCLK signal 300 occurs. The circuit operates to make every output pulse have a duration of at least one cycle of the SYSCLK signal 300 and to have rising edges and falling edges synchronous with the rising edges of the SYSCLK signal 300.

Although the foregoing was described in view of an INPUT signal 302 which was normally low and which changed from the low logic level to the high logic level and back to the low logic level, it should be understood that the circuit 100 operates symmetrically. Thus, if the INPUT signal 302 is normally high and has pulses which change from the high logic level to the low logic level and back to the high logic level, the circuit 100 synchronizes the pulses in the manner described above. It should be further understood that the circuit 100 operates to reproduce the state of the INPUT signal 302 on the OUTPUT (G) signal 316. Thus, the circuit 100 advantageously synchronizes steady-state signals such as data signals and status signals.

The first flip-flop 120 and the second flip-flop 122 are used in tandem to preclude a possible logic race condition which can occur when asynchronous input signals are applied to a clocked logic system. In particular, the D flip-flops 120, 122 have minimum setup and hold times which must be satisfied in order to assure that the outputs of the respective flip-flops will make a single, stable transition after the active edge of the clock signal applied to it. The setup time is the minimum time that an input signal has to be present before the active transition of the clock signal, and the hold time is the minimum amount of time that an input signal has to remain stable after the active transition of the clock signal. If the input signal changes less than the setup time before the active clock transition or changes within the hold time after the active clock transition, the states of the output signals are uncertain and may enter a metastable state. That is, the output signal may oscillate between the high and low state before stabilizing in either the high or low state. Because of the possibility of a metastable output signal when the input signal may change at any time with respect to the clock signal (i.e., asynchronously with respect to the clock signal), the output signal from a D flip-flop which receives an asynchronous input signal cannot be applied to logic which may respond to the output signal when it is in the metastable condition. Thus, the signal F from the output 184 of the first flip-flop 120 cannot be provided directly to other logic (e.g., the signal F cannot be provided as inputs to the NAND gates 112 and 114). On the other hand, the metastable condition typically only lasts for a few nanoseconds. Thus, the F signal 314 can be applied to the D input 192 of the second flip-flop 122 because the metastable condition will cease and the F signal will achieve a stable logic state a sufficient time before the next rising edge of the SYSCLK signal 300. Therefore, the F signal 314 will always satisfy the minimum setup time of the second flip-flop 122. Because the F signal 314 always satisfies the minimum setup and hold times of the second flip-flop 122, the G signal 316 and the H signal 318 provided as outputs of the second flip-flop 122 will never exhibit a metastable condition and can therefore be provided to other logic circuits.

The foregoing is illustrated in FIGS. 3A, 3B, 3C and 3D. As illustrated in FIG. 3B, the INPUT signal 302 has a low-to-high transition 450 which occurs shortly before a falling edge 452 of the SYSCLK signal 300 (FIG. 3A). The low-to-high transition 450 of the INPUT signal 302 propagates through the first NAND gate 112 and the third NAND gate 116, as described above, to cause a low-to-high transition 454 of the D signal 310 (FIG. 3C) which occurs at substantially the same time as the falling edge 452 of the SYSCLK signal 300. Thus, the low-to-high transition 454 does not comply with the setup and hold requirements of the first flip-flop 120, and the F signal 314 (FIG. 3D) output from the first flip-flop 120 exhibits a metastable condition comprising a plurality of alternating high and low logic levels during an interval $T_M$. However, the metastable condition ends well before a next rising edge 456 of the SYSCLK signal 300. As illustrated in FIG. 3D for this particular example, the F signal 314 stabilizes with a low logic level although the D signal 310 is at a high logic level. Thus, the second flip-flop 122 is presented with a stable signal at its D input 192 which satisfies the setup and hold times, and the G signal 316 and the H signal 318 on the outputs 194, 196 of the second flip-flop 122 are guaranteed to be stable even if the F signal 314 initially enters a metastable condition. It should be understood that although the F signal 314 may initially stabilize in the low logic level as illustrated in FIG. 3D, on a next falling edge 458, the D signal 310 is stable in the high logic level (even if the INPUT signal 302 has made an intervening high-to-low transition 460, as illustrated). Thus, the F signal 314 will not exhibit any metastability, and will display a clean transition 462 to its high logic level after the next falling edge 458.

If the rate of the SYSCLK signal 300 is increased such that the duration of the metastable condition of the F signal may exceed the duration of one-half cycle of the SYSCLK signal 300, then the first flip-flop 120 can be replaced with a flip-flop which triggers on the rising edge of the SYSCLK signal 300 to provide a full clock cycle to for the metastable condition to stabilize.

While preferred embodiments of this invention have been disclosed herein, those skilled in the art will appreciate that changes and modifications may be made therein without departing from the spirit and scope of the invention as defined in the appended claims.

What is claimed is:

1. A synchronization circuit which receives an asynchronous input signal and which generates a synchronous output signal responsive to the logic levels of the asynchronous input signal, said circuit comprising:

an input signal selector and a latch which receive said asynchronous input signal and which generate a latched output signal, said input signal selector and latch further receiving a feedback signal, said input signal selector and latch changing said latched output signal from a first latched output state to a second latched output state in response to a transition of said asynchronous input signal from a low logic level to a high logic level when said feedback signal has a first state and changing said latched output signal from said second latched output state to said first latched output state in response to a transition of said asynchronous input signal from a high logic level to a low logic level when said feedback signal has a second state; and a synchronizer which receives said latched output signal and which receives a clock signal, said synchronizer generating a synchronized output signal, said synchronized output signal having a state which only changes logic levels on a predetermined edge of said clock signal, said synchronizer generating said feedback signal in response to said state of said synchronized output signal.

2. The synchronization circuit as defined in claim 1, wherein:

said input signal selector comprises a transition selector responsive to said feedback signal, said transition selector selecting a first logic level of said asynchronous input signal as a selected logic level to which the input signal selector and latch are sensitive when said feedback signal has a first state, said transition selector selecting a second logic level of said asynchronous input signal as said selected logic level to which the input signal selector and latch are sensitive when said feedback signal has a second state, said transition selector providing a first active output signal when said asynchronous input signal changes to said first logic level when said feedback signal has said first state, said transition selector providing a second active output signal when said asynchronous input signal changes to said second logic level when said feedback signal has said second state; and said latch has said first latched output state and said second latched output state, said latch receiving said second active output signal from said transition selector and changing from said first latched output state to said second latched output state, said latch receiving said first active output signal from said transition selector and changing from said second latched output state to said first latched output state.

3. The synchronization circuit as defined in claim 1, wherein said synchronizer comprises:

a first clocked flip-flop having a first clock input, a first data input and a first clocked output signal, said first data input connected to receive a signal responsive to said latched output signal from said input signal latch portion, said first clock input receiving said clock signal, said first clocked output signal changing states responsive to changes in the state of said latched output signal, said first clocked output signal changing state on occurrence of a first selected transition of said clock signal; and a second clocked flip-flop having a second clock input, a second data input and a second clocked output signal, said second data input connected to receive a signal responsive to said first clocked output signal from said first clocked flip-flop, said second clock input receiving said clock signal, said second clocked output signal changing states responsive to changes in the state of said first clocked output signal, said second clocked output signal changing state on occurrence of a second selected transition of said clock signal, said synchronized output signal being responsive to said second clocked output signal.

4. The synchronization circuit as defined in claim 3, wherein said first selected transition of said clock signal comprises a transition of said clock signal from a first logic level to a second logic level and wherein said second selected transition of said clock signal comprises a subsequent transition of said clock signal from said second logic level to said first logic level.

5. The synchronization circuit as defined in claim 3, wherein said feedback signal changes states when said second clocked output signal changes states.

6. A circuit which synchronizes an asynchronous input signal with a clock signal to generate an synchronized output signal which changes states in synchronism with said clock signal, said circuit comprising:

an input signal selector responsive to a first level of said synchronized output signal to select a selected one of a first level and a second level of said asynchronous input signal to which to respond, said input signal selector generating a selector output signal having a first state when said asynchronous input signal changes to said selected one of said first level and said second level, said input signal selector responsive to a second level of said synchronized output signal to select a selected other of said first level and said second level of said asynchronous input signal to which to respond, said input selector generating a selector output signal having a second state when said asynchronous input signal changes to said selected other of said first level and said second level;

a latch responsive to said selector output signal to generate a latched output signal having a first latched state when said asynchronous input signal has said first level and having a second latched state when said asynchronous input signal has said second level; and a synchronizer responsive to said latched output signal and to said clock signal to clock said latched output signal on a selected transition of said clock signal to generate said synchronized output signal.

7. A circuit which synchronizes an asynchronous input signal with a clock signal to generate an synchronized output signal which changes states in synchronism with said clock signal, said circuit comprising:

an asynchronous input circuit responsive to a feedback signal which selects a first level of said asynchronous input signal to which to respond when said feedback signal has a first feedback state, and which selects a second level of said asynchronous input signal to which to respond when said feedback signal has a second feedback state, said asynchronous input circuit outputting a first active output signal when said asynchronous input signal changes to said first level, said asynchronous input circuit outputting a second active output signal when said asynchronous input signal changes to said second level;

an asynchronous latch circuit responsive to said first active output signal and said second active output signal which outputs a latched output signal having a first state responsive to said first active output signal and having a second state responsive to said second active output signal; and a synchronizer circuit which receives said latched output signal and said clock signal, said synchronizer circuit generating said synchronous output signal, said synchronizer circuit further generating said feedback signal, said synchronizer circuit causing said feedback signal to have a selected one of said first and second feedback states to cause said asynchronous input circuit to select one of said first and second levels opposite a previously selected one of said first and second levels.

8. The circuit as defined in claim 7, wherein said latch circuit comprises cross-coupled gates, one of said gates providing said latched output signal, said latched output signal having first and second stable states, said active output signal from said asynchronous input circuit causing said latched output signal to switch from one of said first and second stable states to the other of said first and second stable states.

9. The circuit as defined in claim 7, wherein said synchronizer circuit comprises first and second flip-flops, said first flip-flop receiving said latched output signal and generating a first clocked output signal synchronized with a first transition of said clock signal, said second flip-flop receiving said first clocked output signal and generating a second clocked output signal synchronized with a second transition of said clock signal.

10. The circuit as defined in claim 9, wherein said first transition of said clock signal is a transition from a first clock logic level to a second clock logic level and wherein said second transition of said clock signal is a transition from said second clock logic level to said first clock logic level which occurs one-half of a clock cycle after said first transition.

11. The circuit as defined in claim 7, wherein said feedback signal comprises a signal responsive to a logic level of said synchronized output signal.

12. The circuit as defined in claim 7, wherein said selected one of said first and second levels of said asynchronous input signal to which to respond corresponds to an opposite logic level of logic level of a current state of said synchronized output signal.

* * * * *